United States Patent
Seshita

(10) Patent No.: US 9,020,448 B2
(45) Date of Patent: *Apr. 28, 2015

(54) SWITCH CONTROL CIRCUIT, SEMICONDUCTOR DEVICE, AND RADIO COMMUNICATION DEVICE

(71) Applicant: Kabushiki Kaisha Toshiba, Tokyo (JP)

(72) Inventor: Toshiki Seshita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/140,745

(22) Filed: Dec. 26, 2013

(65) Prior Publication Data
US 2014/0113680 A1   Apr. 24, 2014

Related U.S. Application Data

(63) Continuation of application No. 13/484,503, filed on May 31, 2012, now Pat. No. 8,655,287.

(30) Foreign Application Priority Data

Feb. 17, 2012   (JP) .................................. 2012-33132

(51) Int. Cl.
| H04B 1/44 | (2006.01) |
| H03K 17/687 | (2006.01) |
| H03K 17/693 | (2006.01) |
| H04M 1/78 | (2006.01) |
| H04B 1/02 | (2006.01) |

(52) U.S. Cl.
CPC .......... *H03K 17/6872* (2013.01); *H03K 17/693* (2013.01); *H03K 17/687* (2013.01); *H04M 1/78* (2013.01)

(58) Field of Classification Search
USPC .................................................... 455/78, 550
See application file for complete search history.

(56) References Cited

U.S. PATENT DOCUMENTS

| 8,655,287 | B2 * | 2/2014 | Seshita | ........................... 455/78 |
| 2011/0050323 | A1 | 3/2011 | Seshita | |
| 2011/0159822 | A1 | 6/2011 | Kunishi et al. | |
| 2012/0218010 | A1 | 8/2012 | Seshita | |
| 2012/0225627 | A1 | 9/2012 | Seshita | |

FOREIGN PATENT DOCUMENTS

JP   2000-294786 A   10/2000

* cited by examiner

*Primary Examiner* — Lee Nguyen
(74) *Attorney, Agent, or Firm* — Posz Law Group, PLC

(57) ABSTRACT

A switch control circuit has level shifters connected to a switch circuit to convert voltage levels of control signals, a negative potential generating circuit connected to the level shifter, to generate a negative potential, a negative potential output line supplying the negative potential to the level shifter, and a negative potential output line control circuit configured to control the potential of the negative potential output line. The negative potential output line control circuit has a power-supply setting circuit, an inverter inverting the output signal from the power-supply setting circuit, a first capacitor connected between an output terminal of the inverter and the negative potential output line, and a negative potential initialization circuit.

20 Claims, 11 Drawing Sheets

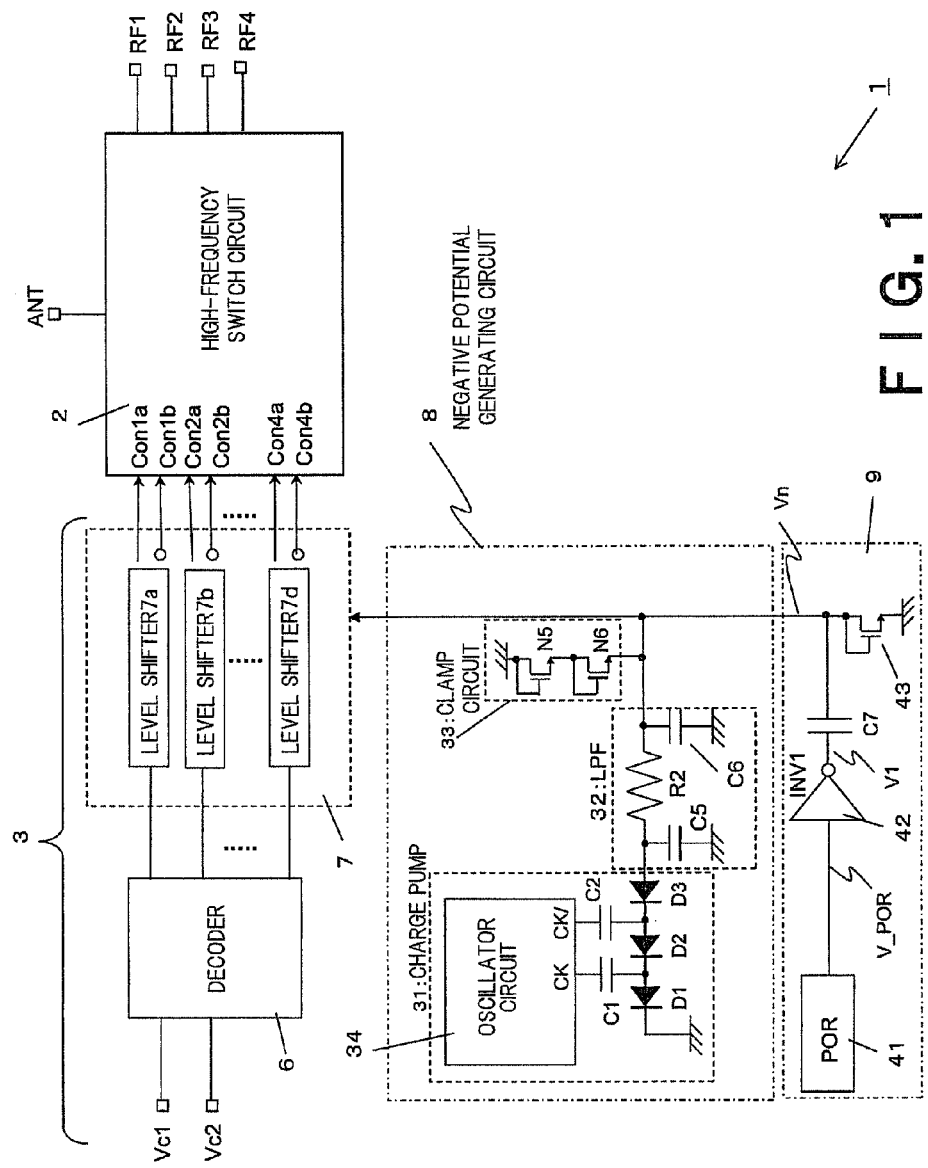
F I G. 1

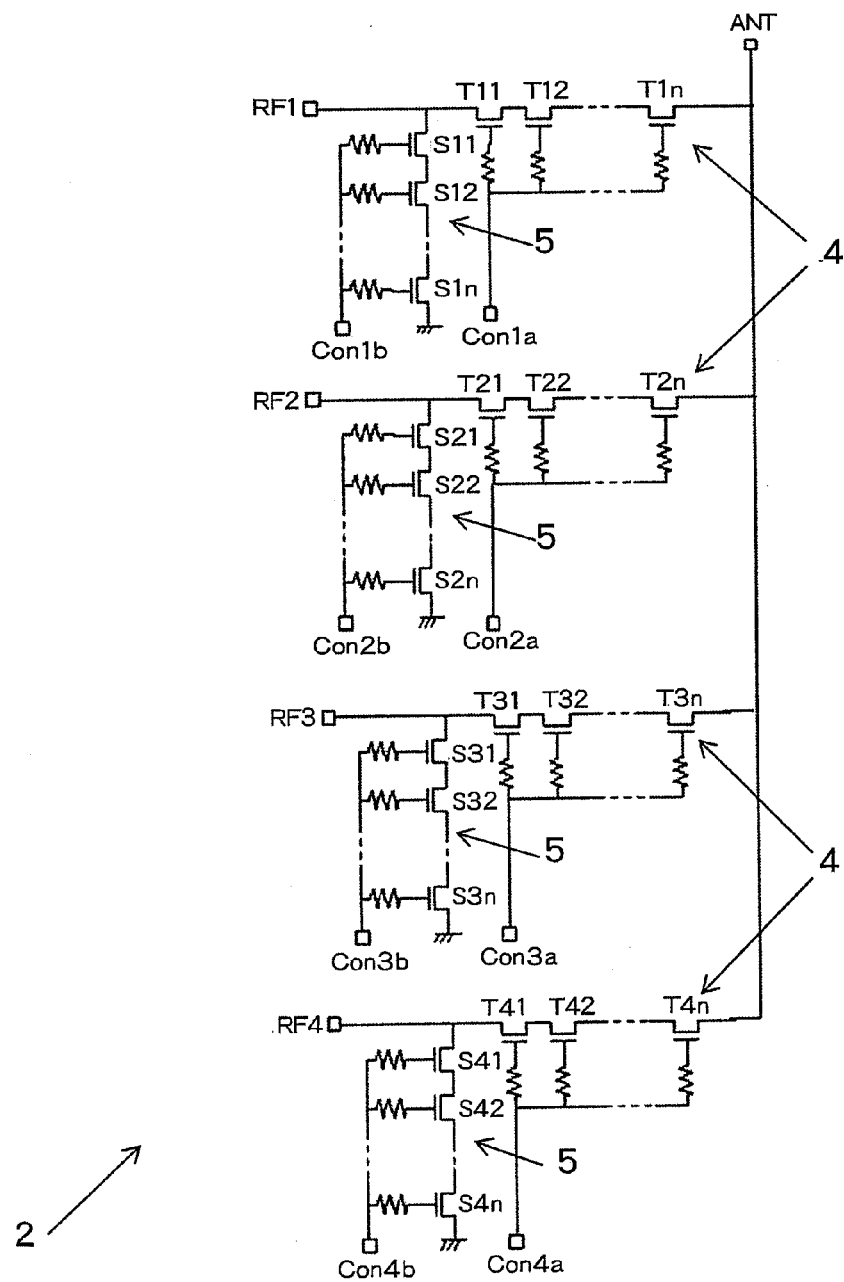
F I G. 2

SWITCH CONTROL CIRCUIT, SEMICONDUCTOR DEVICE, AND RADIO COMMUNICATION DEVICE

CROSS REFERENCE TO RELATED APPLICATIONS

This application is a continuation of U.S. patent application Ser. No. 13/484,503 filed on May 31, 2012 which is based upon and claims the benefit of priority from the prior Japanese Patent Application No. 2012-33132, filed on Feb. 17, 2012, the entire contents of which are incorporated herein by reference.

FIELD

Embodiments of the present invention relate to a switch control circuit for switching a switch circuit, a semiconductor device, and a radio communication device.

BACKGROUND

In a high-frequency circuit unit of a mobile terminal such as cellular phone and smartphone, a transmitter circuit and a receiver circuit are selectively connected to a common antenna through a switch circuit for high-frequency signals (hereinafter referred to as a high-frequency switch circuit). Conventionally, a HEMT (High Electron Mobility Transistor) using a compound semiconductor has been used as a switch element of such a high-frequency switch circuit. However, due to the demands for price reduction and downsizing in recent years, it has been studied to use a MOSFET (Metal Oxide Semiconductor Field Effect Transistor) formed on a silicon substrate, instead of the HEMT.

Note that a general MOSFET formed on a silicon substrate has such problems that the parasitic capacitance between the source or drain electrode and the silicon substrate is large, and that power loss of high-frequency signals is large since silicon is a semiconductor. Thus, a technique for forming the high-frequency switch circuit on an SOI (Silicon On Insulator) substrate has been proposed.

Recent mobile terminals operate in multimode and multiband, and the number of RF signals to be switched by the high-frequency switch has been increased correspondingly.

A switch control circuit for controlling the switching of the high-frequency switch operates at a low-potential logic level, while the high-frequency switch circuit requires larger voltage amplitude than that of the switch control circuit since the high-frequency switch circuit has to transmit and receive RF signals to and from an antenna. For this reason, generally, the switch control circuit has a negative potential generating circuit and a driver circuit to convert potential level by the driver circuit using the negative potential generated by the negative potential generating circuit.

However, there is a likelihood that the output potential of the negative potential generating circuit greatly rises temporarily at the time of switching, and thus a large capacitor is connected between the output terminal of the negative potential generating circuit and a ground terminal in many cases. However, as the size of this capacitor becomes larger, a time required until the output signal from the negative potential generating circuit reaches a desired potential level becomes longer. In order to shorten this time, the capability of a charge pump of a charge pump circuit in the negative potential generating circuit may be increased, but this increases power consumption of the negative potential generating circuit.

BRIEF DESCRIPTION OF THE DRAWINGS

FIG. 1 is a block diagram showing a schematic structure of a semiconductor device having a switch control circuit according to a first embodiment.

FIG. 2 is a circuit diagram showing an example of the internal structure of a high-frequency switch circuit 2.

FIG. 13(a) is a diagram showing a voltage waveform of power-supply potential Vdd whose potential level rises steeply at power-on, while FIG. 13(b) is a diagram showing a voltage waveform of output potential V_POR.

FIG. 14(a) is a diagram showing a voltage waveform of the power-supply potential Vdd whose potential level rises slowly at power-on, while FIG. 14(b) is a diagram showing a voltage waveform of the output potential V_POR.

DETAILED DESCRIPTION

Figure 3:
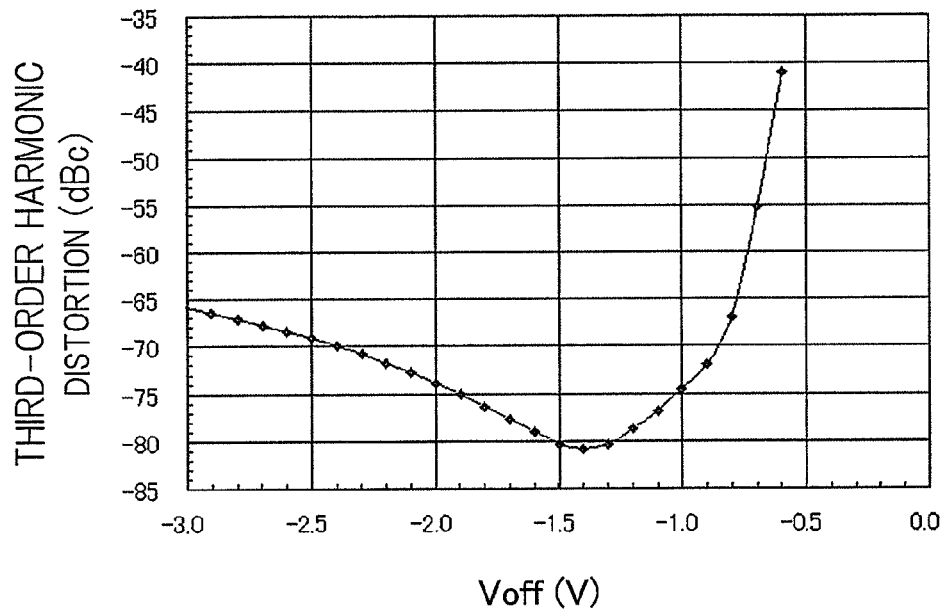
FIG. 3 is a graph showing Voff dependence of third-order harmonic distortion when input power is 35 dBm and n=m=16.

According to one embodiment, a switch control circuit comprising:

level shifters connected to a switch circuit to convert voltage levels of control signals;

a negative potential generating circuit connected to the level shifter, to generate a negative potential;

a negative potential output line supplying the negative potential to the level shifter; and a negative potential output line control circuit configured to control the potential of the negative potential output line, wherein the negative potential output line control circuit comprises:

a power-supply setting circuit outputting a signal which becomes High level after a predetermined period is passed from rise of a power-supply potential;

an inverter inverting the output signal;

a first capacitor connected between an output of the inverter and the negative potential output line; and a negative potential initialization circuit connected to the negative potential output line, to set the negative potential output line to a predetermined voltage level within the predetermined period.

Embodiments of the present invention will now be explained with reference to the accompanying drawings.

First Embodiment

FIG. 1 is a block diagram showing a schematic structure of a semiconductor device 1 having a switch control circuit 3 according to a first embodiment. The semiconductor device 1 of FIG. 1 can be implemented in one chip, but it may be implemented in a plurality of chips or may be partially implemented by discrete components.

The semiconductor device 1 of FIG. 1 has mainly a high-frequency switch circuit 2 and the switch control circuit 3. The high-frequency switch circuit 2 selects one of a plurality of RF signal terminals RF 1 to RF 4, and connects it to a common RF antenna terminal ANT. The RF signal terminals RF 1 to RF 4 are connected to a sending/receiving circuit (not shown in FIG. 1). The sending/receiving circuit supports a plurality of wireless standards, and generates RF signals each being different corresponding to each wireless standard. As mentioned later, a radio communication device is mounted with at least one semiconductor device 1 of FIG. 1. Note that the number of RF signal terminals switched by the high-frequency switch circuit 2 should not be limited to four.

FIG. 2 is a circuit diagram showing an example of the internal structure of the high-frequency switch circuit 2. The high-frequency switch circuit 2 of FIG. 2 is called an SP4T (Single-Pole 4-Throw) switch. This SP4T switch switches which one of four RF terminals RF 1 to RF 4 should be electrically connected to the common RF terminal ANT, depending on parallel switching control signals Con 1 to Con 4. The common RF terminal ANT is connected to an antenna ANT.

The SP4T switch of FIG. 2 has through FETs 4 connected in series in multiple stages between the common RF terminal ANT and each of the four RF terminals RF 1 to RF 4 and shunt FETs 5 connected in series in multiple stages between each RF terminal and each ground terminal. Threshold voltage Vth of each FET is 0 V, for example.

Voltage swings dozens of volts in transmission operation, and thus the through FETs 4 and the shunt FETs 5 are both connected in series in multiple stages in order to suppress the voltage applied to each FET.

Hereinafter, the operation of the SP4T switch of FIG. 2 will be explained based on an example where the RF terminal RF 1 is electrically connected to the common RF terminal ANT. In this case, a switching control signal Con 1a has High potential (Von) and the through FETs 4 having gates inputted with the switching control signal Con 1a are turned on, while a switching control signal Con 1b has Low potential (Voff) and the shunt FETs 5 having gates inputted with the switching control signal Con 1b are turned off. Further, the other through FETs 4 are turned off, and the other shunt FETs 5 are turned on.

The potential Von of the switching control signal Con 1a is at a potential level enough to electrically connect the through FETs 4 and make the on-resistance thereof sufficiently small, while the potential Voff of the switching control signal Con 1b is gate potential capable of keeping the cutoff state of the shunt FETs 5 even when the RF signal is superposed.

When Von is lower than a desired potential (e.g., 2.4 V), on-resistance of the FETs electrically connected is increased, which deteriorates insertion loss characteristics and increases distortion (ON distortion) caused in the FET electrically connected.

Further, Voff is higher than a desired potential, the maximum allowable input power is reduced and distortion (OFF distortion) caused in the FETs which are cut off at the time of normal input is increased. Note that there is an optimum point since OFF distortion characteristics deteriorate when Voff is excessively large in the negative direction.

FIG. 3 is a graph showing Voff dependence of third-order harmonic distortion when input power is 35 dBm and n=m=16. This figure shows that the level of the third-order harmonics becomes minimum (=−81 dBc) when Voff=−1.4 V.

Referring back to FIG. 1, the switch control circuit 3 has a decoder 6, a driver circuit 7 including a plurality of level shifters 7a to 7d, a negative potential generating circuit 8, and a negative potential output line control circuit 9.

The decoder 6 decodes switching control signals Vc 1 and Vc 2 inputted from the outside. In the example of FIG. 1, the decoder 6 decodes 2-bit switching control signals Vc 1 and Vc 2 inputted from the outside, and generates 4-bit switching control signals.

Figure 4:
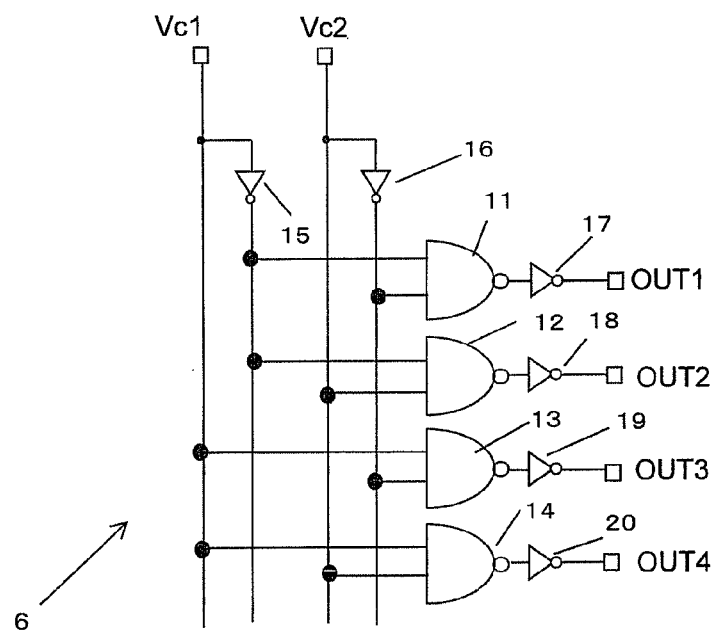
FIG. 4 is a circuit diagram showing an example of the internal structure of a decoder 6.

FIG. 4 is a circuit diagram showing an example of the internal structure of the decoder 6. The decoder 6 of FIG. 4 has four NAND circuits 11 to 14, and inverters 15 to 20 arranged on the input side and the output side of the NAND circuits 11 to 14. The NAND circuits 11 to 14 are arranged corresponding to four kinds of logical combinations between the two-bit switching control signals Vc 1 and Vc 2 inputted from the outside. Only the output from the NAND circuit corresponding to the actual logical combination of the two-bit switching control signals Vc 1 and Vc 2 becomes Low.

As shown in FIG. 4, various circuit configuration may be used for the decoder 6 since the decoder 6 can be composed based on the combinations of logical gates, and concrete circuit configuration is not questioned. Further, the decoder 6 is not necessarily essential, and the decoder 6 may be omitted by inputting unencoded switching control signals from the outside.

4-bit switching control signals OUT 1 to OUT 4 decoded by the decoder 6 are inputted into the driver circuit 7. The driver circuit 7 has the same number of level shifters 7a to 7d as the number of bits of the decoded switching control signal, and converts the potential of the switching control signal with respect to each bit.

More concretely, each of the level shifters 7a to 7d converts a signal having ground potential as Low level and having power-supply potential Vdd as High level into a signal having negative potential Vn as Low level and having the power-supply potential Vdd as High level. Note that it is also possible to increase the potential level on the High level side, but in the example of the present embodiment, only the potential level on the Low level side is converted for simplification.

Figure 5:
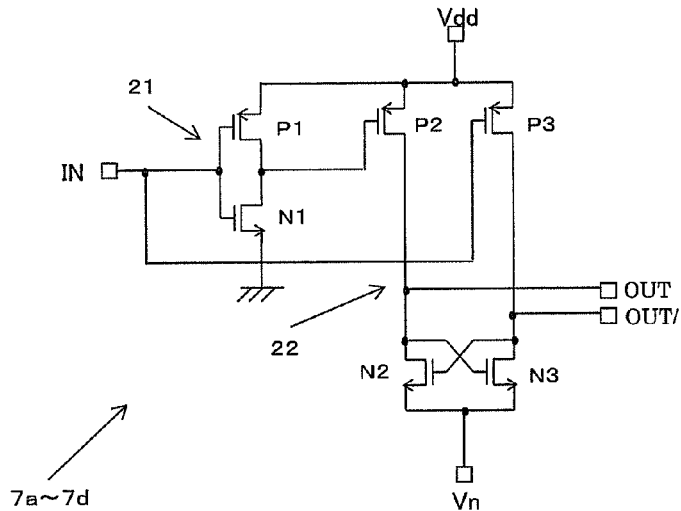
FIG. 5 is a circuit diagram showing an example of the internal structure of each of level shifters 7a to 7d.

FIG. 5 is a circuit diagram showing an example of the internal structure of each of the level shifters 7a to 7d. As shown in FIG. 5, each of the level shifters 7a to 7d has an inverter 21 formed of a PMOS transistor P1 and an NMOS transistor N1, and a differential amplifier 22 formed of two PMOS transistors P2 and P3 and two NMOS transistors N2 and N3.

The input signal into each of the level shifters 7a to 7d and the inverted signal inverted by the inverter 21 are inputted into the differential input terminals of the differential amplifier 22. The positive power-supply potential of the differential amplifier 22 is Vdd, and the negative power-supply potential thereof is Vn. Accordingly, signals having Vdd as High level and having Vn as Low level are outputted from differential output terminals OUT and OUT/ of the differential amplifier 22. Vn is −1.4 V, for example.

The negative power-supply potential Vn inputted into the level shifters 7a to 7d is generated by the negative potential generating circuit 8 of FIG. 1. As shown in FIG. 1, the negative potential generating circuit 8 has a charge pump 31, a lowpass filter (LPF) 32, and a clamping circuit 33.

The charge pump 31 has an oscillator circuit 34, two capacitors C1 and C2 connected to differential output terminals CK and CK/ of the oscillator circuit 34 respectively, and a plurality of diodes D1 to D3 connected in series between a ground terminal and the output terminal of the charge pump 31. The other end of each of the two capacitors C1 and C2 is connected between the diodes D1 to D3 connected in series.

The forward voltage of the diodes D1 to D3 has a constant value and the capacitors C1 and C2 retain charges. By utilizing these characteristics, the output potential of the charge pump 31 becomes a predetermined negative potential.

The output potential of the charge pump 31 goes through waveform shaping by the lowpass filter 32, and then voltage swing on the negative potential side is suppressed to about twice the threshold voltage of a transistor by the clamping circuit 33, thereby generating a final negative potential. The clamping circuit 33 is formed of two NMOS transistors N5 and N6 establishing cascode connection between ground potential and the negative voltage output line Vn, and the output potential of the lowpass filter 32 is clamped using the threshold voltage of the two NMOS transistors N5 and N6.

Figure 6:
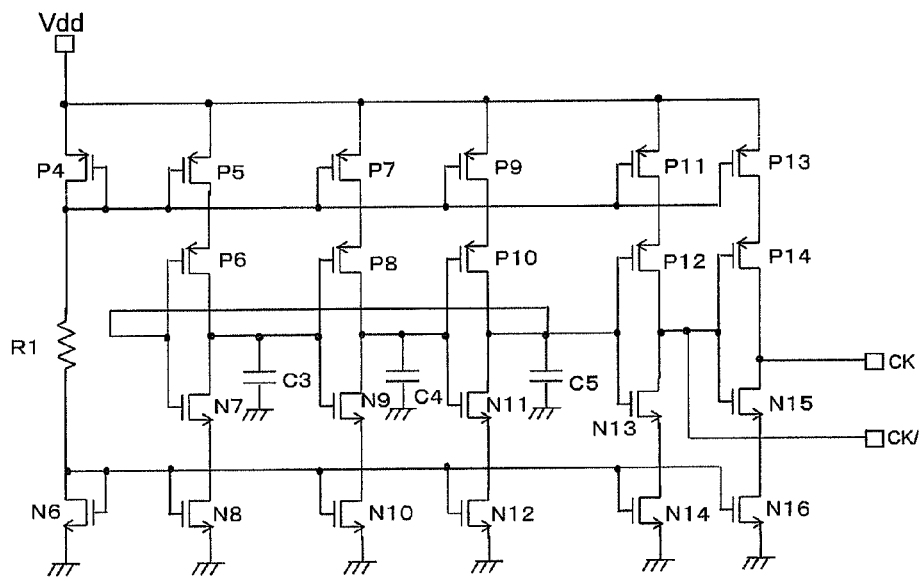
FIG. 6 is a circuit diagram showing an example of the internal structure of an oscillator circuit 34 in a charge pump 31.

The oscillator circuit 34 in the charge pump 31 is formed as shown in FIG. 6, for example. The oscillator circuit 34 of FIG. 6 functions as a ring oscillator using PMOS transistors P4 to P14, NMOS transistors N6 to N16, a resistance R1, and capacitors C3 to C5.

The lowpass filter 32 has a resistance R2 connected on the output line of the charge pump 31, and capacitors C5 and C6 each connected between one/the other end of the resistance R2 and a ground terminal. The capacitor C6 on the side of the clamping circuit 33 influences the capacitance of the negative potential output line Vn, and this capacitor should be made smaller as much as possible or may be omitted in the present embodiment.

In a conventional circuit without the negative potential output line control circuit 9, the capacitance corresponding to the capacitor C6 in the lowpass filter 32 of the negative potential generating circuit 8 shown in FIG. 1 is set to large capacitance about hundreds of pF. The reason why this is caused will be explained below.

Figure 7:
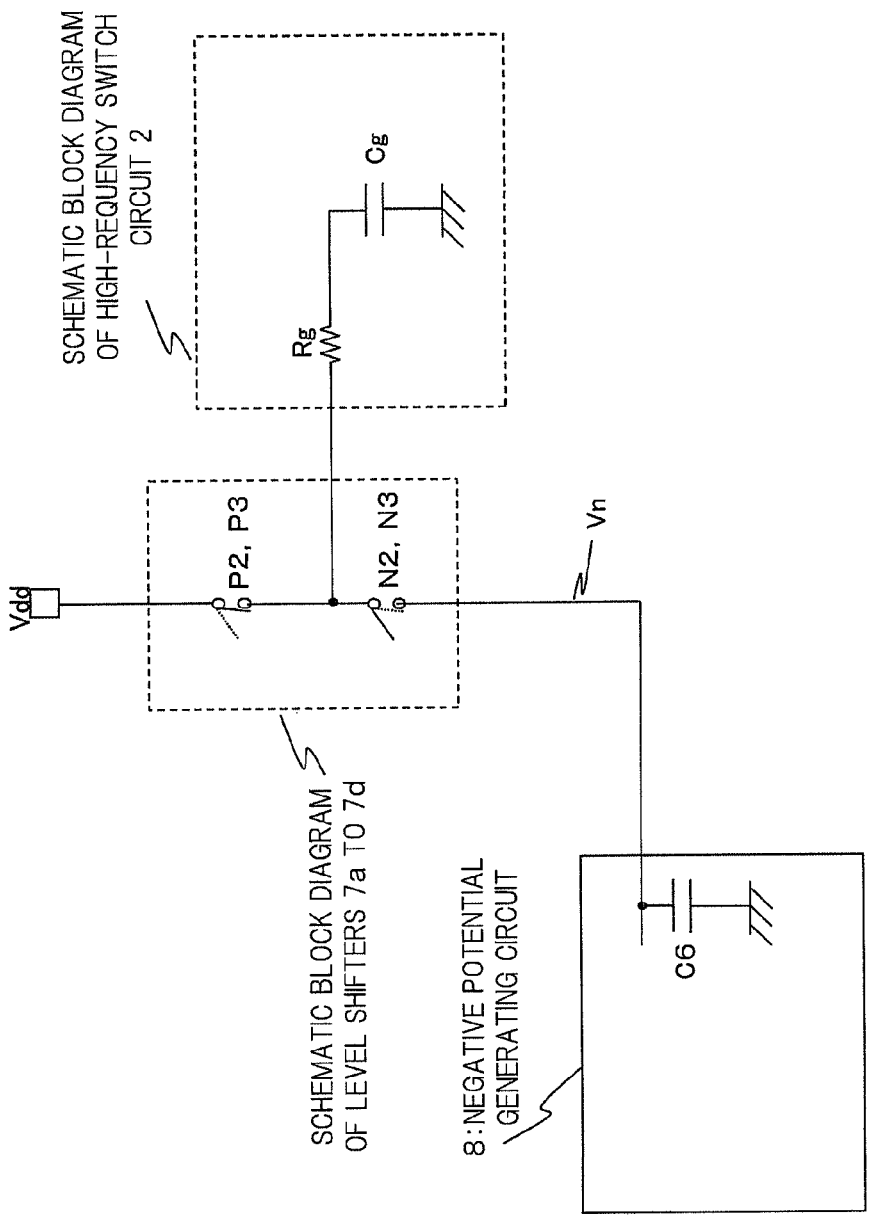
FIG. 7 is a diagram simplistically showing the path of a negative potential output line Vn.

FIG. 7 is a diagram simplistically showing the path of the negative potential output line Vn. As shown in FIG. 7, each of the level shifters 7a to 7d is supplied with the power-supply potential Vdd on the High side from a Vdd power-supply terminal, and supplied with the power-supply potential Vn on the Low side through the negative potential output line Vn. As shown in FIG. 7, the NMOS transistors N2 and N3 and the PMOS transistors P2 and P3 in each of the level shifters 7a to 7d are connected on the negative potential output line Vn. Loads of the level shifters 7a to 7d are the gates of the FETs 4 and 5 in the high-frequency switch circuit 2. These gates can be expressed as a high resistance Rg and a gate capacitance Cg equivalently.

Since high-power signals must be passed with low loss when switching the antenna and high-frequency signals, the total gate width of the FETs in the high-frequency switch circuit 2 becomes large and the number of connection stages of the FETs also becomes large. Accordingly, Cg defined as the total capacitance of the gates to be driven becomes dozens of pF or greater.

On the other hand, the charge pump 31 incorporated into a normal IC can supply current of only several to dozens of µA, and thus cannot charge/discharge the capacitance of dozens of pF at high speed. In order to supply the transient current, the output of the charge pump 31 is required to have a large capacitance having a value which is several to dozens of times larger than Cg.

Figure 8:
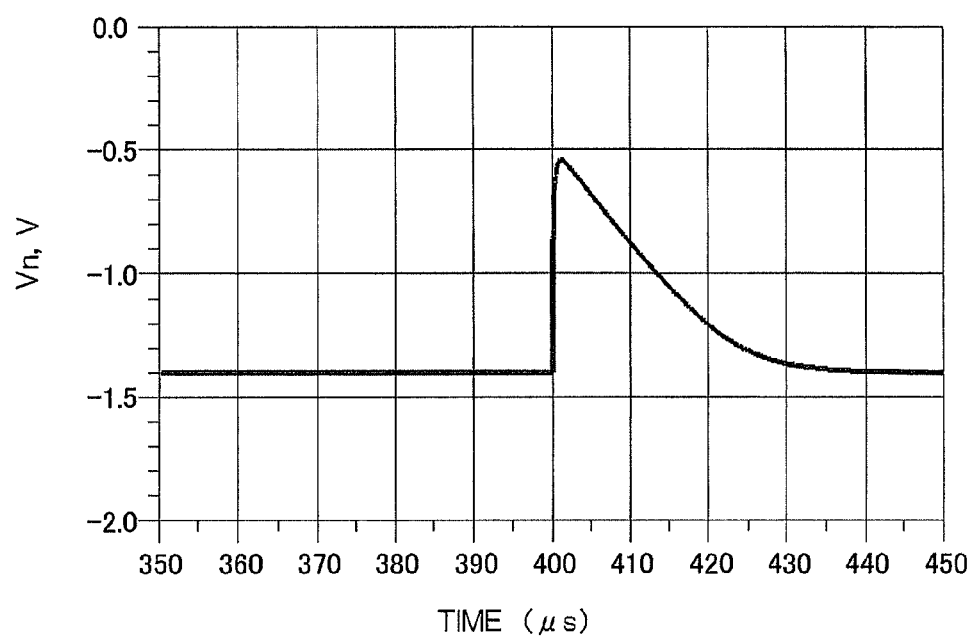
FIG. 8 is a diagram showing a potential waveform of the negative potential output line Vn.

FIG. 8 is a diagram showing a potential waveform of the negative potential output line Vn when the high-frequency switch circuit 2 is switched at a certain time (t=400µ seconds). At the moment when the high-frequency switch circuit 2 is switched, charges stored in Cg of FIG. 7 are discharged toward the negative potential output line Vn, and Vn rises momentarily. After that, Vn gradually approaches a steady-state value at a time constant corresponding to the current capability of the charge pump 31 in the negative potential generating circuit 8.

It is not desirable that Vn rises instantaneously when the high-frequency switch circuit 2 is switched, as shown in FIG. 8. In order to suppress the instantaneous rise of Vn, the capacitor C6 in the lowpass filter 32 of FIG. 1 must be set to a larger value.

However, time required until the output potential Vn of the negative potential generating circuit 8 becomes a desired negative potential after power-on (start-up time) becomes longer as the capacitor C6 is made larger. In order to increase the capacitance of the capacitor C6 while shortening the start-up time, the capability of the charge pump 31 must be increased. However, when increasing the capability of the charge pump 31, consumption current is also increased.

In view of this problem, in the present embodiment, the negative potential output line control circuit 9 is arranged as shown in FIG. 1. The negative potential output line control circuit 9 has a power-supply setting circuit 41, an inverter 42, a capacitor C7, and a negative potential initialization circuit 43.

The power-supply setting circuit 41 outputs a Low potential signal for a predetermined time (e.g., 0.6µ seconds) after power-supply potential is supplied to the switch control circuit 3, and outputs a High potential signal after the predetermined time has passed.

Current drive performance of the inverter 42 is set as higher as possible in order to set the potential of the negative potential output line Vn to a desired negative potential quickly. The capacitor C7 has a capacitance value (e.g., hundreds of pF) larger than that of the capacitor in the lowpass filter 32.

The negative potential initialization circuit 43 is formed of an NMOS transistor connected between the negative potential output line Vn and a ground terminal. The drain and gate of this transistor are connected to the negative potential output line Vn, and the source thereof is grounded. The threshold voltage of this transistor is set to a positive value close to 0 V (e.g., 0.3 V).

Next, the operation of the switch control circuit 3 according to the present embodiment will be explained. Immediately after power-on, the output from the inverter 42 has High potential Vdd while the power-supply setting circuit 41 still outputs Low potential. At this time, the negative potential output line Vn is led to positive potential through the capacitor C7, but the potential is clamped when it reaches the threshold voltage (about 0.3 V) of the diode-connected NMOS transistor 43 in the negative potential initialization circuit 43.

When a predetermined time (about 0.6 μsecond) has passed after power-on, the output potential of the power-supply setting circuit 41 becomes High potential, and the output from the inverter 42 is switched to 0 V. If the current drive performance of the inverter 42 is set sufficiently high, the output from the inverter 42 steeply changes from Vdd to 0 V. Since the capacitor C7 tries to retain stored charges, the potential of the negative potential output line Vn steeply becomes negative potential.

For example, when Vdd=3 V, the threshold voltage of the NMOS transistor 43 (Vth)=0.3 V, the capacitance of the capacitor C6 in the lowpass filter 32 is 0F, the potential Vn of the negative potential output line Vn when a predetermined time has passed after power-on becomes −2.7 V.

As shown in FIG. 7, after a predetermined time has passed from power-on, charges stored in the capacitor C7 are consumed to charge the gate capacitance Cg of the FETs in the high-frequency switch circuit 2 through the NMOS transistors N2 and N3 of each of the level shifters 7a to 7d and the high resistance Rg connected to the gates of the FETs in the high-frequency switch circuit 2. Accordingly, in the period corresponding to the time constant (e.g., 2 μseconds) determined by the product of Rg and Cg, the potential of the negative potential output line Vn rises and reaches about −1 V, for example. After that, the charge pump 31 makes the potential fall to a desired potential (e.g., −1.4 V).

Based on the above operation, it takes only about 3 μseconds until the negative potential output line Vn has a potential of about −1 V after power-on, and thus start-up time can be considerably shortened.

As stated above, in the first embodiment, the negative potential output line control circuit 9 is connected to the negative potential output line Vn which has a potential of about 0 V immediately after power-on and which has a desired negative potential quickly when a predetermined time has passed after power-on. Accordingly, the potential of the negative potential output line Vn can be quickly set to a desired negative potential without being influenced by the number of level shifters 7a to 7d in the driver circuit 7, the gate capacitance of the FETs in the high-frequency switch circuit 2, and the high resistance connected to their gates.

Second Embodiment

A second embodiment explained below is characterized in improving the characteristics of the inverter 42 in the negative potential output line control circuit 9.

The switch control circuit 3 according to the second embodiment is the same as FIG. 1 in terms of a block diagram, but the internal structure of the inverter 42 in the negative potential output line control circuit 9 is different from the first embodiment.

Figure 9:
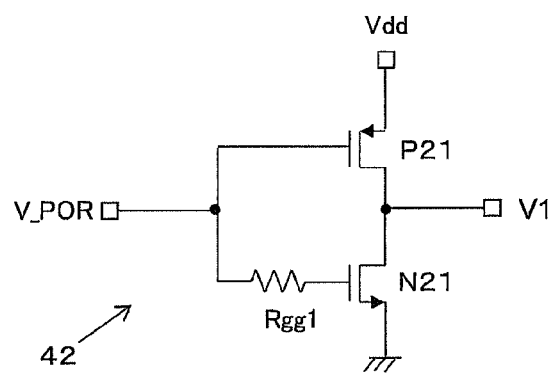
FIG. 9 is a circuit diagram showing the internal structure of an inverter 42 in a negative potential output line control circuit 9 according to a second embodiment.

FIG. 9 is a circuit diagram showing the internal structure of the inverter 42 in the negative potential output line control circuit 9 according to the second embodiment. The inverter 42 of FIG. 9 has a PMOS transistor P21 connected between the power-supply potential Vdd and an output terminal, an NMOS transistor N21 connected between ground potential and the output terminal, and a resistance Rgg 1 connected between the gate of the NMOS transistor N21 and an input terminal.

The back gate of the NMOS transistor N21 is floating, and the resistance Rgg 1 has a high resistance (e.g., 100 k ohm or greater) enough to prevent a high-frequency signal from leakage. It is a prerequisite to form the switch control circuit 3 according to the present embodiment on an SOI substrate together with the high-frequency switch circuit 2 for the reasons explained in the "BACKGROUND" section. When forming the NMOS transistor N21 on an SOI substrate, its back gate can be made floating easily.

When the back gate of the NMOS transistor N21 is set floating and the gate thereof is connected to a high resistance, the source and drain become electrically equivalent and the source and drain can be regarded as forming a two-terminal circuit, which broadens the region where the relationship between drain-source current and drain-source voltage becomes linear. More concretely, the source-drain current/voltage characteristics of the NMOS transistor N21 become symmetrical with respect to 0 V, and become approximately linearly both when the relationship between source-drain current and source-drain voltage is minus and plus.

The linear region of the NMOS transistor N21 should be broadened for the following reason. The capacitor C7 in the negative potential output line control circuit 9 has a large capacitance of hundreds of pF and naturally requires a large layout area, which leads to a problem of electromagnetic coupling with the high-frequency switch circuit 2. More concretely, due to electromagnetic coupling with the high-frequency switch circuit 2, high-frequency signals in the high-frequency switch circuit 2 are superposed on the capacitor C7.

In a normal state where the high-frequency switch circuit 2 operates, the output from the inverter 42 in the negative potential output line control circuit 9 has Low potential. That is, the NMOS transistor N21 in the inverter 42 is turned on. Accordingly, the gate potential of this NMOS transistor N21 is at High level, and the voltage between the drain and source thereof is 0 V. Under these bias conditions, impedance when seeing the source of the NMOS transistor N21 from the drain thereof becomes generally non-linear. Accordingly, the high-frequency signal superposed on the capacitor C7 due to the electromagnetic coupling with the high-frequency switch circuit 2 generates distortion in the NMOS transistor N21. Then, this distortion is transmitted to the high-frequency switch circuit 2 through the capacitor C7 due to the electromagnetic coupling with the high-frequency switch circuit 2, and further superposed on the original distortion of the high-frequency switch circuit 2 in the end.

On the other hand, when the back gate of the NMOS transistor N21 in the inverter 42 of the negative potential output line control circuit 9 is set floating and the gate thereof is connected to the high resistance Rgg 1 as in the present embodiment, the linear region of this transistor is broadened, which eliminates the likelihood that distortion of the high-frequency signal superposed on the capacitor C7 due to the electromagnetic coupling with the high-frequency switch circuit 2 is increased by the inverter 42 and the distortion newly generated in the inverter 42 is transmitted to the high-frequency circuit. Accordingly, according to the present embodiment, high-frequency distortion on the negative potential output line Vn can be reduced.

Third Embodiment

A third embodiment explained below is characterized in further improving the characteristics of the inverter 42 in the negative potential output line control circuit 9.

The switch control circuit 3 according to the third embodiment is the same as FIG. 1, but the internal structure of the inverter 42 in the negative potential output line control circuit 9 is different from the second embodiment.

Figure 10:
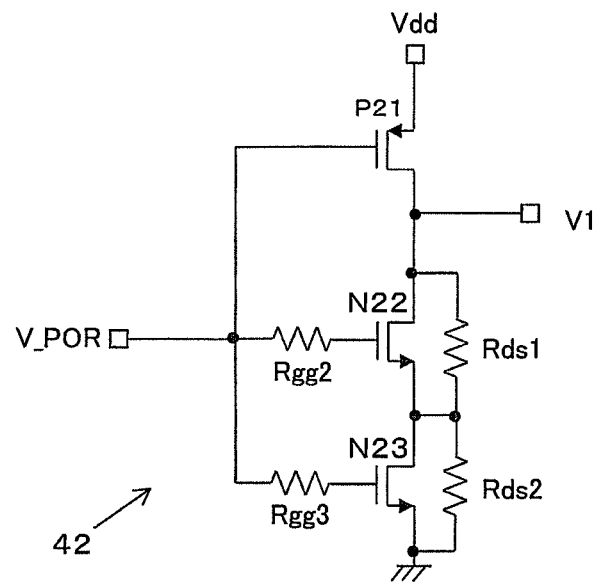
FIG. 10 is a circuit diagram showing the internal structure of the inverter 42 in the negative potential output line control circuit 9 according to a third embodiment.

FIG. 10 is a circuit diagram showing the internal structure of the inverter 42 in the negative potential output line control circuit 9 according to the third embodiment. The inverter 42 of FIG. 10 is formed of two NMOS transistors N22 and N23 which are the same as the NMOS transistor N21 of FIG. 9 and are cascode-connected to each other, high resistances Rgg 2 and Rgg 3 connected to the gates of the NMOS transistors N22 and N23, and resistances Rds1 and Rds2 each connected between the source and drain of the NMOS transistor N22/N23.

The back gate of the NMOS transistor N22/N23 is floating, and the resistance Rgg 2/Rgg 3 connected to the gate thereof has a high resistance (e.g., 100 k ohm or greater) enough to prevent a high-frequency signal from leakage. Further, the resistances Rds1 and Rds2 each connected between the source and drain of the NMOS transistor N22/N23 have the same resistance value (e.g., 30 k ohm) in order to equalize the drain-source voltage of the NMOS transistor N22/N23 when turned off.

In FIG. 10, two NMOS transistors N22 and N23 are cascode-connected, but three or more NMOS transistors may be cascode-connected.

As stated above, in the third embodiment, as shown in FIG. 10, a plurality of the NMOS transistors (N22 and N23) are cascode-connected between the output terminal of the inverter 42 and the ground terminal, and the gates of the NMOS transistors N22 and N23 are connected to high resistances while setting the back gates of the NMOS transistors N22 and N23 floating, which makes it possible to broaden the region where the relationship between drain-source current and drain-source voltage becomes linear, compared to the case where one NMOS transistor (N21) is connected. This is because the source-drain voltage of the NMOS transistor N22/N23 becomes lower than that of the NMOS transistor N21 solely connected.

Further, by connecting the resistance Rds1/Rds2 connected between the source and drain of the NMOS transistor N22/N23, voltage applied between the drain and source of the transistor N22/N23 can be equally set. The resistances Rds1 and Rds2 should not be necessarily arranged.

Fourth Embodiment

A fourth embodiment explained below is characterized in further improving the electric characteristics of the inverter 42 in the negative potential output line control circuit 9, compared to the third embodiment.

Figure 11:
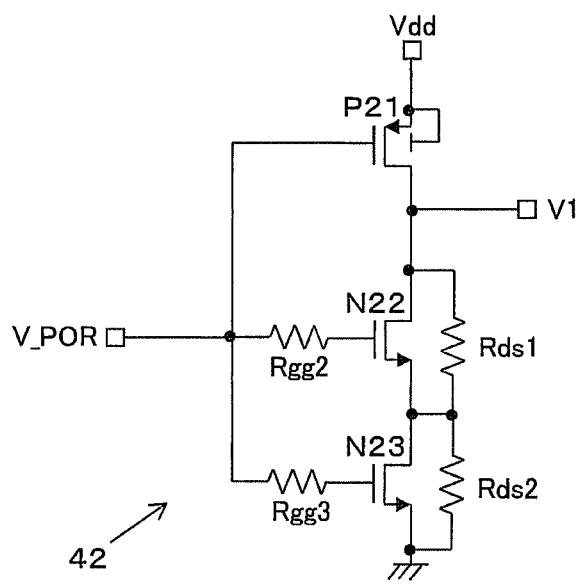
FIG. 11 is a circuit diagram showing the internal structure of the inverter 42 in the negative potential output line control circuit 9 according to a fourth embodiment.

FIG. 11 is a circuit diagram showing the internal structure of the inverter 42 in the negative potential output line control circuit 9 according to the fourth embodiment. The inverter 42 of FIG. 11 is different from the inverter 42 of FIG. 10 in the PMOS transistor P21. In FIG. 10, configuration of the back gate of the PMOS transistor P21 is not particularly specified, while the back gate of the PMOS transistor P21 of FIG. 11 is connected to the source. When connecting the back gate to the source, drain breakdown voltage increases. Accordingly, the inverter 42 of FIG. 11 can further increase the power-supply potential Vdd.

Note that the back gate of the PMOS transistor P21 of the inverter 42 in FIG. 9 may be connected to the source.

Fifth Embodiment

A fifth embodiment explained below is characterized in the internal structure of the power-supply setting circuit 41 in the negative potential output line control circuit 9.

Figure 12:
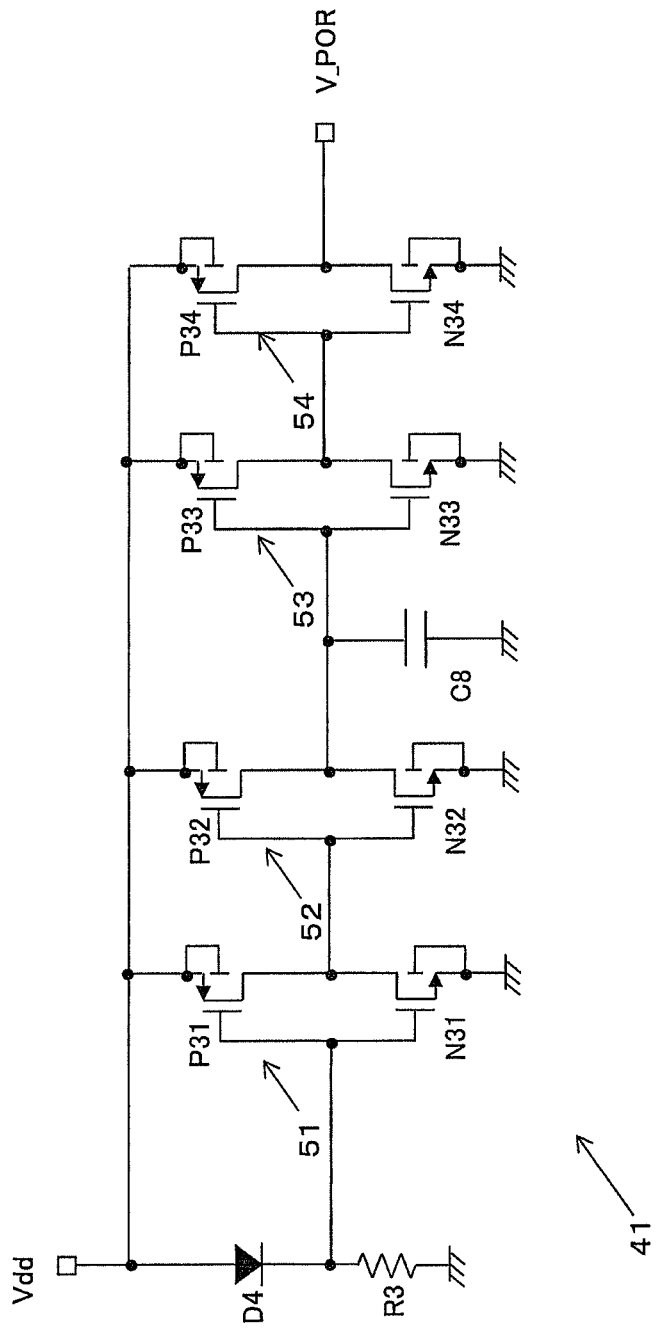
FIG. 12 is a circuit diagram showing the internal structure of a power-supply setting circuit 41 in the negative potential output line control circuit 9 according to a fifth embodiment.

FIG. 12 is a circuit diagram showing the internal structure of the power-supply setting circuit 41 in the negative potential output line control circuit 9 according to the fifth embodiment. The power-supply setting circuit 41 of FIG. 12 has a diode D4 having an anode connected to the power-supply potential Vdd, a resistance R3 connected between the cathode of the diode D4 and ground potential, a first CMOS inverter 51 for inverting the cathodic potential of the diode D4, a second CMOS inverter 52 for inverting the output signal from the first CMOS inverter 51, a third CMOS inverter 53 for inverting the output signal from the second CMOS inverter 52, a fourth CMOS inverter 54 for inverting the output signal from the third CMOS inverter 53, and a capacitor C8 connected between the output terminal of the second CMOS inverter 52 and ground potential.

The first to fourth CMOS inverters 51 to 54 have PMOS transistors P31 to P34 each having a source connected to the power-supply potential Vdd and a drain connected to the output terminal, and NMOS transistors N31 to N34 each having a drain connected to the output terminal and a source connected to ground potential, respectively. The back gate of each of these transistors is connected to the source. This makes it possible to increase the drain breakdown voltage of the first to fourth CMOS inverters 51 to 54, and to increase the power-supply potential Vdd.

If there is no need to increase the drain breakdown voltage, the back gates of these transistors may be set floating.

Further, the ratio of gate width to gate length of the PMOS 32 is set smaller than that of the PMOS 31. That is, on-resistance of the PMOS 32 is set larger than that of the PMOS 31.

In FIG. 12, the diode D4 and the resistance R3 in the power-supply setting circuit 41 are used to set power supply when the power-supply potential Vdd rises slowly at power-on. Further, in FIG. 12, the on-resistance of the PMOS 32 of the second CMOS inverter 52 is used to set power supply when the power-supply potential Vdd steeply rises at power-on.

Figure 13:
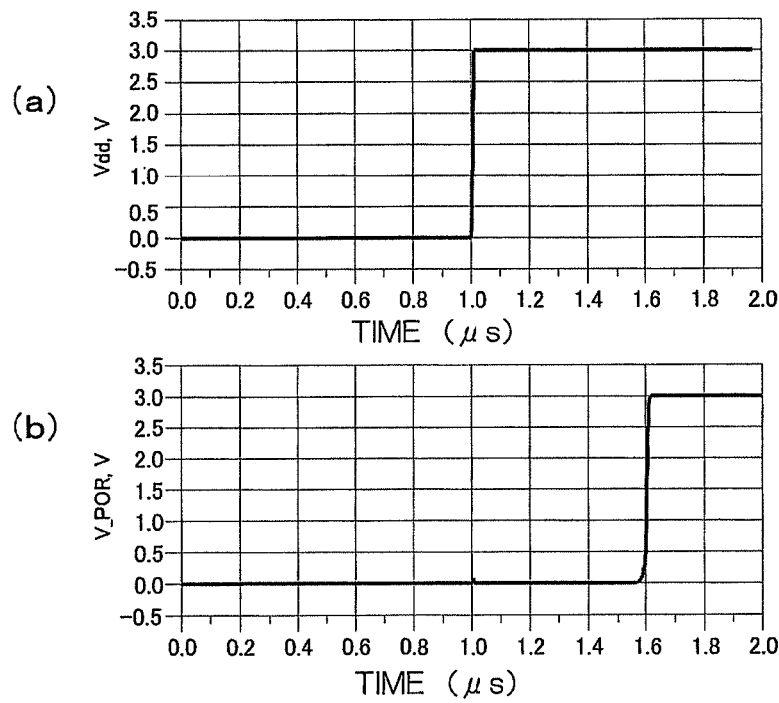

FIG. 13(a) shows a voltage waveform of the power-supply potential Vdd whose potential level rises steeply at power-on. In this case, when the potential of the power-supply potential Vdd rises, the potential of the cathode of the diode D4 also rises immediately, and then the NMOS transistor N31 in the first CMOS inverter 51 is turned on and the output potential of the first CMOS inverter 51 becomes Low level. Therefore, the PMOS transistor P32 in the second CMOS inverter 52 is turned on, and the output potential of the second CMOS inverter 52 becomes High level after a predetermined time determined the time constant of an integration circuit formed of the on-resistance of the PMOS transistor P31 and the capacitor C8. When the output potential of the second CMOS inverter 52 becomes High level, it is inverted by the third CMOS inverter 53, and further inverted by the fourth CMOS inverter 54, in order to output output potential V_POR.

FIG. 13(b) is a diagram showing a voltage waveform of the output potential V_POR. As shown in this figure, the output potential V_POR rises after about 0.6 μsecond has passed since the power-supply potential Vdd became High level.

Figure 14:
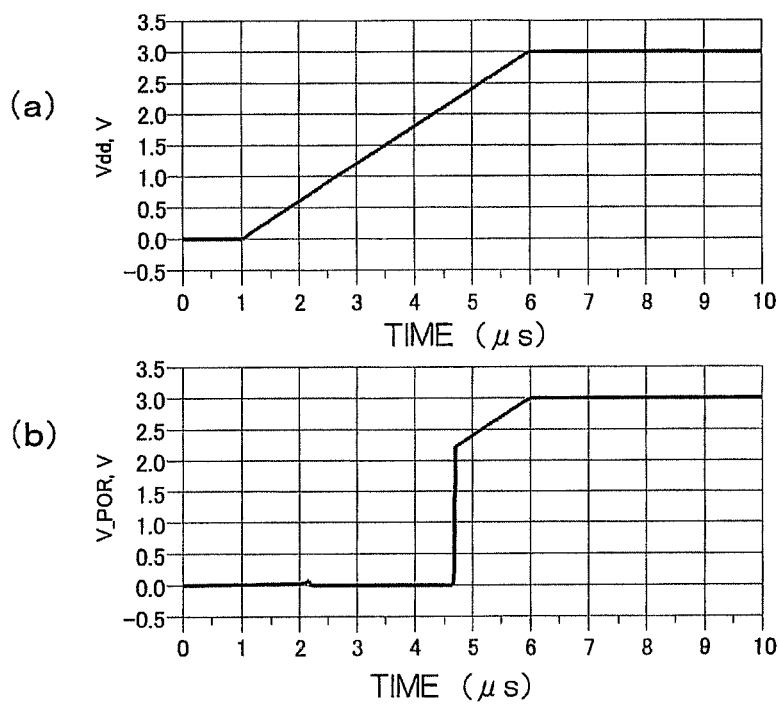

On the other hand, as shown in FIG. 14(a), when the power-supply potential Vdd rises slowly at power-on, the output potential of an integration circuit formed of the on-resistance of the PMOS transistor P32 in the second CMOS inverter 52 and the capacitor C8 does not rise steeply. In this case, the integration circuit is not used, and when the potential of the connection node of the diode D4 and the resistance R3 exceeds the threshold voltage of the first CMOS inverter 51, the CMOS inverters 51 to 54 sequentially start inversion operation to finally output the output potential V_POR from the fourth CMOS inverter 54. The voltage waveform of the output potential V_POR in this case is as shown in FIG. 14(b). In FIG. 14(b), the output potential V_POR rises (at about 4.7 µsecond) when the power-supply potential Vdd reaches about 2.2 V. Shortly before this point, the potential of the connection node of the anode of the diode D4 and the resistance R3 exceeds the threshold value of the first CMOS inverter 51, and the first to fourth CMOS inverters 51 to 54 sequentially repeat inversion operation, by which the output potential V_POR rises.

Figure 15:
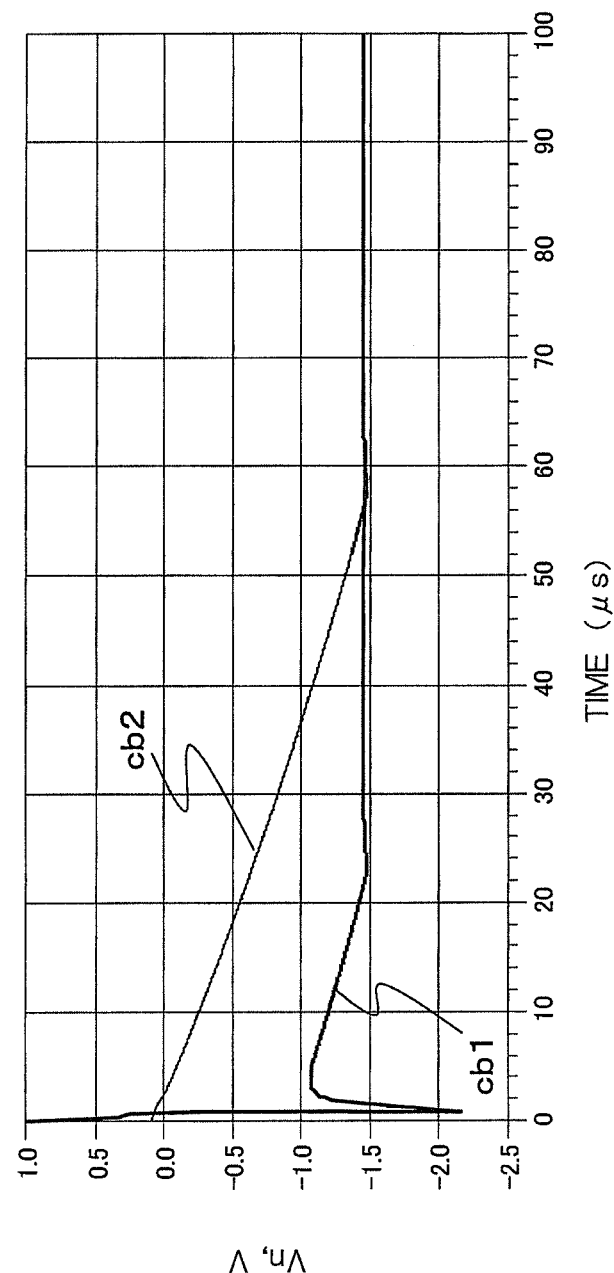
FIG. 15 is a diagram showing a voltage waveform cb 1 of output potential Vn of a negative potential generating circuit 8, and a voltage waveform cb 2 of the output potential Vn of the negative potential generating circuit 8 in a comparative example where a negative potential output line control circuit 9 is omitted, each of the waveforms being based on simulation results.

FIG. 15 is a diagram showing a voltage waveform cb 1 of the output potential Vn of the negative potential generating circuit 8, and a voltage waveform cb 2 of the output potential Vn of the negative potential generating circuit 8 in a comparative example where the negative potential output line control circuit 9 is omitted, each of the waveforms being based on simulation results. In this case, the power-supply setting circuit 41 of FIG. 12 and the inverter 42 of FIG. 11 are used in the negative potential output line control circuit 9 of FIG. 1. In FIG. 15, the horizontal axis represents time (µsecond), and the vertical axis represents the potential Vn of the negative potential output line.

The following circuit constants are used in this simulation. The circuit constants used to obtain the voltage waveform cb 1 are as follows: the capacitor C6=0; the capacitor C7=0; the PMOS transistor P21 in the inverter 42=250 µm (gate width) and 0.35 µm (gate length); the NMOS transistor N21 in the inverter 42=4 mm (gate width) and 0.25 µm (gate length); the resistances Rgg 2 and Rgg 3=320 k ohm; the resistances Rds1 and Rds2=30 k ohm; the capacitor C8=95 pF; the PMOS transistor P31 in the power-supply setting circuit 41=10 µm (gate width) and 0.35 µm (gate length); the PMOS transistor P32=1 µm (gate width) and 0.35 µm (gate length); and the threshold voltage of the NMOS transistor 43=0.3 V.

Further, the circuit constant used to obtain the voltage waveform cb 2 is as follows: the capacitor C6=500 pF.

Further, both of the voltage waveforms cb 1 and cb 2 are obtained under the following common conditions: the power-supply potential Vdd=3 V; and rise time of power-supply potential is 10 ns.

As shown in the simulation results of FIG. 15, in the comparative example, time required for the output potential Vn of the negative potential generating circuit 8 to reach −1.4 V is 54 µseconds, while in the present embodiment, it is 19 µseconds, which shows that the output potential Vn reaches a desired negative potential in only about 35% of time required in the comparative example.

Hereinafter, characteristics of the voltage waveform cb 1 in FIG. 15 will be explained. When power is applied at time 0, the potential of the negative potential output line Vn suddenly rises to 0.7 V, and then immediately falls to 0.3 V. This shows that the potential of the negative potential output line Vn is clipped at the threshold voltage of the NMOS transistor in the negative potential initialization circuit 43. After that, around the time of 0.6 µsecond, the output from the power-supply setting circuit 41 becomes High level, and the output from the inverter 42 falls from High to Low. Since the capacitor C6 tries to store charges, the potential of the negative potential output line Vn greatly falls temporarily and reaches about −2.2 V. After that, the potential of the negative potential output line Vn starts rising, which is because a large gate capacitance of each FET arranged in the high-frequency switch circuit 2 serving as a load of the level shifter is connected on the negative potential output line Vn via the level shifter 7a to 7f and the capacitance flows into the capacitor C6. The potential the negative potential output line Vn temporarily rises to −1.1 V. After that, it is settled at a desired negative potential by the charge pumping operation of the charge pump 31.

As stated above, in the power-supply setting circuit 41 of the fifth embodiment, a plurality of CMOS inverters 51 to 54 connected in series are arranged, and the diode D4 and the resistance R3 connected in series are arranged between the power-supply potential and ground potential while connecting the connection node of the diode D4 and the resistance R3 to the input terminal of the CMOS inverter 51 arranged in the first stage, which makes it possible to surely set power supply both when the power-supply potential rises suddenly and when it rises slowly at power-on.

Figure 16:
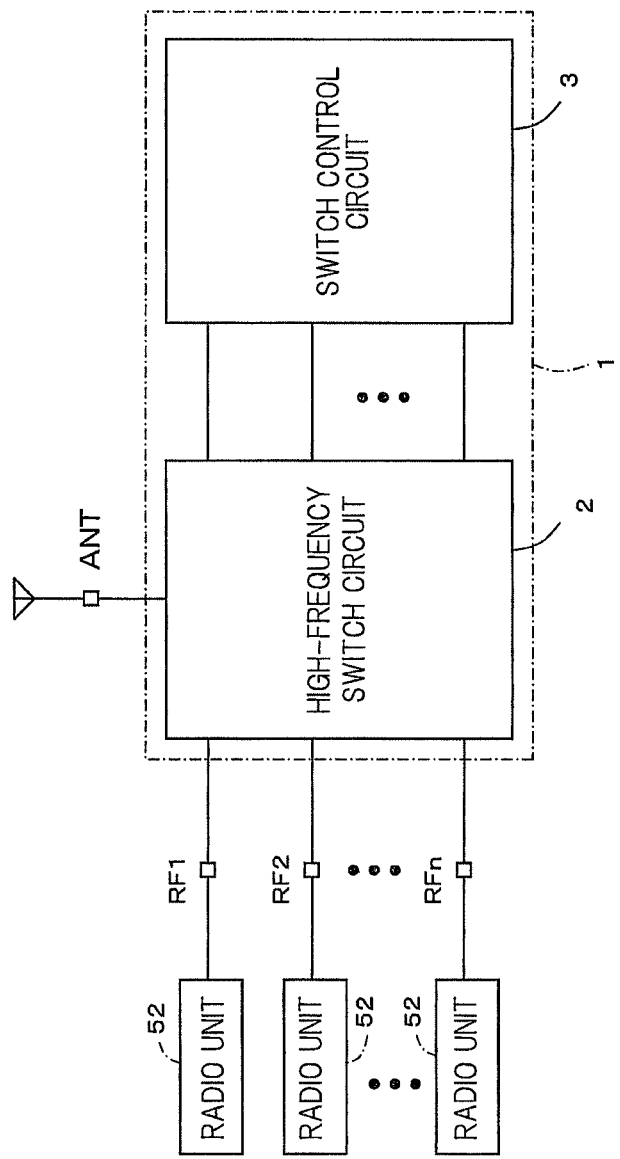
FIG. 16 is a block diagram showing a schematic structure of a radio communication device mounted with a semiconductor device 1 according to any one of the first to fifth embodiments.

FIG. 16 is a block diagram showing a schematic structure of a radio communication device mounted with the semiconductor device 1 according to any one of the first to fifth embodiments. The radio communication device of FIG. 16 is one of various wireless devices such as cellular phone, smartphone, PC, etc. capable of switching a plurality of wireless standards.

A radio communication device 51 of FIG. 16 has a plurality of radio units 52 which are different from each other at least in frequency band or wireless standard and perform wireless communication separately, and the above semiconductor device 1 connected to the radio units 52. The radio units 52 and the semiconductor device 1 may be formed as separate chips mounted on a supporting substrate (e.g., printed wiring board), or may be formed on the same semiconductor substrate. Further, a plurality of semiconductor devices 1 may be arranged in the radio communication device 51.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor switch comprising:
a first circuit configured to generate a first negative potential;
a high-frequency switch part configured to switch a connection state for high-frequency terminals in accordance with the first negative potential;
a second circuit configured to generate a first potential in accordance with a power supply potential;
a third circuit configured to delay an output of the second circuit;
a fourth circuit configured to invert an output of the third circuit; and
a first capacitor disposed between an output of the fourth circuit and an output of the first circuit.

2. The switch of claim 1, further comprising:
a fifth circuit configured to clamp the output of the first circuit to a reference potential at power-on reset.

3. The switch of claim 1, further comprising:
a sixth circuit configured to convert a potential on low level side of a first switching control signal used for switching-control of the high-frequency switch part into the first negative potential to generate and supply a second switching control signal to the high-frequency switch part, wherein the high-frequency switch part switches the connection state for high-frequency terminals based on the second switching control signal.

4. The switch of claim 1, wherein the third circuit comprises:
a plurality stages of buffer circuits connected in series; and
a second capacitor connected between at least one output of the buffer circuits and a reference potential.

5. The switch of claim 1, wherein the second circuit comprises:
a diode connected in series between a power supply potential and a reference potential; and
a first impedance element,
wherein the first potential is generated at a connection between the diode and the first impedance element.

6. The switch of claim 1, wherein the first circuit comprises an NMOS transistor having a source which is grounded, a gate and a drain each connected to the negative potential output line, and a back gate which is floating, the NMOS transistor having a positive threshold voltage, and
the negative potential output line is set to a potential corresponding to the threshold voltage of the NMOS transistor immediately after the rise of the power-supply potential.

7. The switch of claim 1, wherein the fourth circuit comprises:
a first PMOS transistor having a source connected to the power-supply potential, a gate connected to an output terminal of the third circuit, and a drain connected to one end of the first capacitor;
a second NMOS transistor having a source which is grounded, a drain connected to one end of the first capacitor, and a back gate which is floating; and
a second impedance element connected between the gate of the second NMOS transistor and the output of the third circuit.

8. The switch of claim 1, wherein the fourth circuit comprises:
a first PMOS transistor having a source connected to the power-supply potential, a gate connected to an output terminal of the third circuit, and a drain connected to one end of the first capacitor;
an NMOS group including two or more second NMOS transistors having cascode connection between one end of the first capacitor and a ground terminal;
third impedance elements each connected between a gate of each second NMOS transistor in the NMOS group and the output of the third circuit; and
fourth impedance elements each connected between a drain and a source of each second NMOS transistor in the NMOS group, and each of the second NMOS transistors in the NMOS group having a back gate which is floating.

9. The switch of claim 1, wherein the first PMOS transistor has a back gate connected to the source.

10. A semiconductor device comprising:
a first circuit configured to generate a first negative potential;
a high-frequency switch part configured to switch a connection state for high-frequency terminals in accordance with the first negative potential;
a second circuit configured to generate a first potential in accordance with a power supply potential;
a third circuit configured to delay an output of the second circuit;
a fourth circuit configured to invert an output of the third circuit;
a first capacitor disposed between an output of the fourth circuit and an output of the first circuit;
a fifth circuit configured to clamp the output of the first circuit to a reference potential at power-on reset;
a decoder configured to decode a switching control signal inputted to generate a first switching control signal; and
a sixth circuit configured to convert a potential on low level side of a first switching control signal used for switching-control of the high-frequency switch part into the first negative potential to generate and supply a second switching control signal to the high-frequency switch part.

11. The device of claim 10, wherein the third circuit further comprises:
a plurality stages of buffer circuits connected in series; and
a second capacitor connected between at least one output of the buffer circuits and a reference potential.

12. The device of claim 10, wherein the second circuit comprises:
a diode connected in series between a power supply potential and a reference potential; and
a first impedance element,
wherein the first potential is generated at a connection between the diode and the first impedance element.

13. The device of claim 10, wherein the first circuit comprises an NMOS transistor having a source which is grounded, a gate and a drain each connected to the negative potential output line, and a back gate which is floating, the NMOS transistor having a positive threshold voltage, and
the negative potential output line is set to a potential corresponding to the threshold voltage of the NMOS transistor immediately after the rise of the power-supply potential.

14. The device of claim 10, wherein the fourth circuit comprises:
a first PMOS transistor having a source connected to the power-supply potential, a gate connected to an output terminal of the third circuit, and a drain connected to one end of the first capacitor;
a second NMOS transistor having a source which is grounded, a drain connected to one end of the first capacitor, and a back gate which is floating; and
a second impedance element connected between the gate of the second NMOS transistor and the output of the third circuit.

15. The device of claim 10, wherein the fourth circuit comprises:
a first PMOS transistor having a source connected to the power-supply potential, a gate connected to an output terminal of the third circuit, and a drain connected to one end of the first capacitor;
an NMOS group including two or more second NMOS transistors having cascode connection between one end of the first capacitor and a ground terminal;
third impedance elements each connected between a gate of each second NMOS transistor in the NMOS group and the output of the third circuit; and
fourth impedance elements each connected between a drain and a source of each second NMOS transistor in the NMOS group, and each of the second NMOS transistors in the NMOS group having a back gate which is floating.

16. A radio communication apparatus comprising:
a plurality of radio units inputted with and to output high-frequency signals corresponding to different wireless standards; and a switch circuit configured to select one of a plurality of high-frequency signals based on switching control signals, wherein the switch circuit comprises:

a first circuit configured to generate a first negative potential;

a high-frequency switch part configured to switch a connection state for high-frequency terminals in accordance with the first negative potential;

a second circuit configured to generate a first potential in accordance with a power supply potential;

a third circuit configured to delay an output of the second circuit;

a fourth circuit configured to invert an output of the third circuit; and a first capacitor disposed between an output of the fourth circuit and an output of the first circuit.

17. The apparatus of claim 16, further comprising:

a fifth circuit configured to clamp the output of the first circuit to a reference potential at power-on reset.

18. The apparatus of claim 16, further comprising:

a sixth circuit configured to convert a potential on low level side of a first switching control signal used for switching-control of the high-frequency switch part into the first negative potential to generate and supply a second switching control signal to the high-frequency switch part, wherein the high-frequency switch part switches the connection state for high-frequency terminals based on the second switching control signal.

19. The apparatus of claim 16, wherein the third circuit comprises:

a plurality stages of buffer circuits connected in series; and a second capacitor connected between at least one output of the buffer circuits and a reference potential.

20. The apparatus of claim 16, wherein the second circuit comprises:

a diode connected in series between a power supply potential and a reference potential; and a first impedance element, wherein the first potential is generated at a connection between the diode and the first impedance element.

* * * * *